(12) United States Patent
Lee et al.

(10) Patent No.: US 8,377,748 B2
(45) Date of Patent: Feb. 19, 2013

(54) METHOD OF MANUFACTURING COOLING FIN AND PACKAGE SUBSTRATE WITH COOLING FIN

(75) Inventors: Eung Suek Lee, Gyunggi-do (KR); Je Gwang Yoo, Gyunggi-do (KR); Chang Sup Ryu, Gyunggi-do (KR); Jun Oh Hwang, Gyunggi-do (KR); Jun Heyoung Park, Gyunggi-do (KR); Jee Soo Mok, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 13/137,669

(22) Filed: Sep. 1, 2011

(65) Prior Publication Data

US 2011/0308069 A1  Dec. 22, 2011

Related U.S. Application Data

(62) Division of application No. 12/219,442, filed on Jul. 22, 2008, now abandoned.

(30) Foreign Application Priority Data

May 30, 2008  (KR) .................. 10-2008-0051003

(51) Int. Cl.
  *H01L 23/467* (2006.01)
(52) U.S. Cl. ............... 438/122; 257/722; 257/E23.099; 257/E21.505; 29/592.1; 29/890.03
(58) Field of Classification Search .................. 257/722; 438/122
See application file for complete search history.

(56) References Cited

U.S. PATENT DOCUMENTS

| 2006/0057768 A1* | 3/2006 | Nakanishi et al. ............ 438/106 |
| 2008/0174963 A1* | 7/2008 | Chang et al. .................. 361/700 |
| 2008/0230894 A1* | 9/2008 | Heydari et al. ............... 257/714 |

FOREIGN PATENT DOCUMENTS

| JP | 2002-110874 | 4/2002 |
| JP | 2004-207690 | 7/2004 |
| JP | 2004-349685 | 12/2004 |
| JP | 2007-169446 | 7/2007 |

OTHER PUBLICATIONS

Korean Office Action issued Apr. 30, 2010 in corresponding Korean Patent Application No. 10-2008-0051003.
Japanese Office Action issued on May 31, 2011 in corresponding Japanese Patent Application No. 2008-211566.
U.S. Patent Restriction Requirement mailed Sep. 16, 2010 in corresponding U.S. Appl. No. 12/219,442.
U.S. Patent Office Action mailed Nov. 24, 2010 in corresponding U.S. Appl. No. 12/219,442.
U.S. Patent Final Office Action mailed May 9, 2011 in corresponding U.S. Appl. No. 12/219,442.
U.S. Appl. No. 12/219,442, filed Jul. 22, 2008, Eung Suek Lee et al., Samsung Electro-Mechanics Co., Ltd.

\* cited by examiner

*Primary Examiner* — Mamadou Diallo

(57) ABSTRACT

A method of manufacturing a cooling fin and package substrate that includes preparing a mold, which has a support base and a resin layer formed on the support base and including on a side thereof a groove, which is configured to form a cooling fin; printing fireable paste containing a carbon component on a side of the mold that has the groove configured to form a cooling fin; removing the support base to leave a cooling object; and firing the cooling object.

13 Claims, 3 Drawing Sheets

METHOD OF MANUFACTURING COOLING FIN AND PACKAGE SUBSTRATE WITH COOLING FIN

CROSS-REFERENCE TO RELATED APPLICATIONS

This application is a U.S. divisional application filed under 37 CFR 1.53(b) claiming priority benefit of U.S. Ser. No. 12/219,442 filed in the United States on Jul. 22, 2008 now abandoned, which claims earlier priority benefit to Korean Patent Application No. 10-2008-0051003 filed with the Korean Intellectual Property Office on May 30, 2008, the disclosures of which are incorporated herein by reference.

BACKGROUND

1. Field

The present invention relates generally to a cooling fin and a package substrate comprising the cooling fin and a manufacturing method thereof, and, more particularly, to a cooling fin, which is excellent in cooling performance and is simply manufactured, a package substrate comprising the cooling fin, and a manufacturing method thereof

2. Description of the Related Art

These days, in response to miniaturization and the widening of the functionality of electronic products, more passive/active devices and semiconductor chips (IC) are mounted in the electronic products and packaged. However, as the number of their mounting and packaging are increased, power consumption and heat generation are increased, thus exerting a bad influence on reliability of products and on their attractiveness to customers.

Accordingly, in order to solve the above problems caused by the heat generation, a variety of research on cooling fins is being conducted. Recently, intensive research is being concentrated on a cooling fin incorporating carbon nanotubes (CNT) which have excellent thermal conductivity, i.e., a thermal conductivity ten times or greater than that of copper.

A carbon nanotube is typically produced through chemical vapor deposition (CVD). FIG. 1 shows a carbon nanotube 13, which is produced through chemical vapor deposition.

Referring to FIG. 1, conventional carbon nanotubes 13 are produced in a manner such that nano-sized catalytic metal particles 12 are formed on a silicon substrate 11 and then the carbon nanotubes 13 grow vertically from the catalytic metal particles through a high temperature synthesis process conducted at a temperature ranging from 500° C. to 1000° C. The carbon nanotubes 13 which have been produced in such a manner are attached to a target object so as to serve as cooling fins.

If chemical vapor deposition is used, although it is possible to grow the carbon nanotubes in a vertical direction, it is impossible to enable the carbon nanotubes to have various structures. Thus, there is a limit to the production of cooling fins whose high cooling performance is due to an increase in the surface area of the cooling fins.

Further, since the chemical vapor deposition process must be conducted at a relatively high temperature ranging from 500° C. to 1000° C., the base material from which the carbon nanotubes can be grown is disadvantageously restricted to ones which can be used at the high temperature, for example, the silicon substrate 11, as illustrated in FIG. 1.

Furthermore, the conventional process is disadvantageous in that there are needs for a separate metal catalyst 12 adapted to grow the carbon nanotube as well as a special container having a high hermetic performance regarding forming a nano-sized metal catalyst 12 on the silicon substrate 11, thus increasing equipment costs.

SUMMARY

Accordingly, the present invention has been made keeping in mind the above problems occurring in the prior art, and the present invention provides a cooling fin, which may have various configurations by incorporating a fired object containing carbon component, and a method of manufacturing the cooling fin.

Furthermore, the present invention provides a cooling fin, which may be manufactured a simple process of injecting fireable paste containing carbon nanotubes or carbon nanofiber, and a method of manufacturing the cooling fin.

Furthermore, the present invention provides a package substrate, which may be manufactured by attaching a cooling fin having an improved cooling performance to the package substrate, and a method of manufacturing the package substrate.

Furthermore, the present invention provides a package substrate, which includes a cooling fin that is configured to have a cover structure to improve a cooling performance, and which shields a printed circuit board including a semiconductor chip from an external environment in a sealing manner, thus obviating an additional resin encapsulation, and a method of manufacturing the package substrate.

In one aspect, the present invention provides a cooling fin comprising a fired object containing a carbon component.

The fired object may include carbon nanotubes or carbon nanofibers, and metal microparticles.

In another aspect, the present invention provides a package substrate including: a printed circuit board on which a semiconductor chip is mounted; and a cooling fin bonded to the semiconductor chip and comprising a fired object containing a carbon component.

The fired object may include carbon nanotubes or carbon nanofibers, and metal microparticles.

The cooling fin may be configured to have a cover structure so as to protect a surface of the printed circuit board including the semiconductor chip from an external environment in a sealing manner.

In still another aspect, the present invention provides a method of manufacturing a cooling fin, including: preparing a mold, which comprises a support base and a resin layer formed on the support base and including on a side thereof a groove, which is configured to form a cooling fin; printing fireable paste containing a carbon component on a side of the mold that has the groove configured to form a cooling fin; removing the support base to leave a cooling object; and firing the cooling object.

The preparing the mold may include: placing the resin layer on a side of the support base; imprinting the resin layer with a stamp having a pattern corresponding to the groove; and removing the stamp.

The method may further include, after printing the fireable paste, drying the fireable paste which is printed.

The fireable paste may include carbon nanotubes or carbon nanofibers, metal microparticles and a binder.

The firing the cooling object may cause the resin layer and the binder to be eliminated.

The method may further include, after firing the cooling object, removing the resin layer and the binder which are not eliminated by the firing, through reactive ion etching (RIE).

In a further aspect, the present invention provides a method of manufacturing a package substrate, including: preparing a mold, which comprises a support base and a resin layer formed on the support base and including on a side thereof a groove configured to form a cooling fin; printing fireable paste containing a carbon component on a side of the mold including the groove; removing the support base to leave a cooling object; firing the cooling object to prepare a cooling fin; and bonding the cooling fin on a semiconductor chip mounted on a printed circuit board.

The preparing the mold may include: placing the resin layer on a side of the support base; imprinting the resin layer with a stamp having a pattern corresponding to the groove; and removing the stamp.

The method may further include, after printing the fireable paste, drying the fireable paste which is printed.

The fireable paste may include carbon nanotubes or carbon nanofibers, metal microparticles and a binder.

The firing the cooling object may cause the resin layer and the binder to be eliminated.

The method may further include, after firing the cooling object, removing the resin layer and the binder, which are not eliminated by the firing, through reactive ion etching (RIE).

The cooling fin may be configured to have a cover structure so as to protect a surface of the printed circuit board including the semiconductor chip from an external environment in a sealing manner.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF EMBODIMENTS

Hereinafter, preferred embodiments of the present invention will be described in greater detail with reference to the accompanying drawings.

Figure 1:
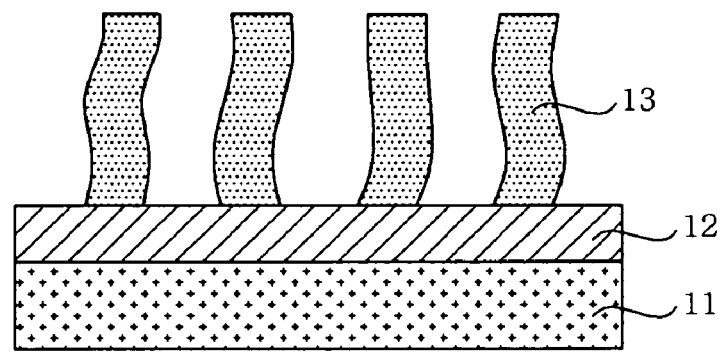
FIG. 1 is a cross-sectional view showing a carbon nanotube, which is produced through conventional chemical vapor deposition.
Figure 2:
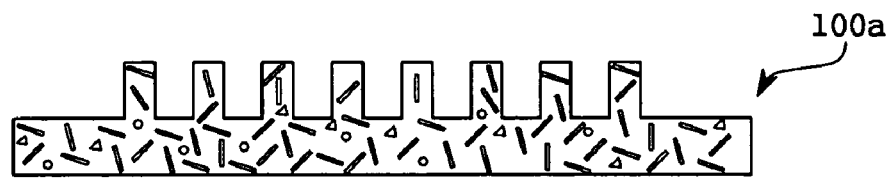
FIG. 2 is a cross-sectional view showing a cooling fin according to a preferred embodiment of the present invention.
Figure 3:
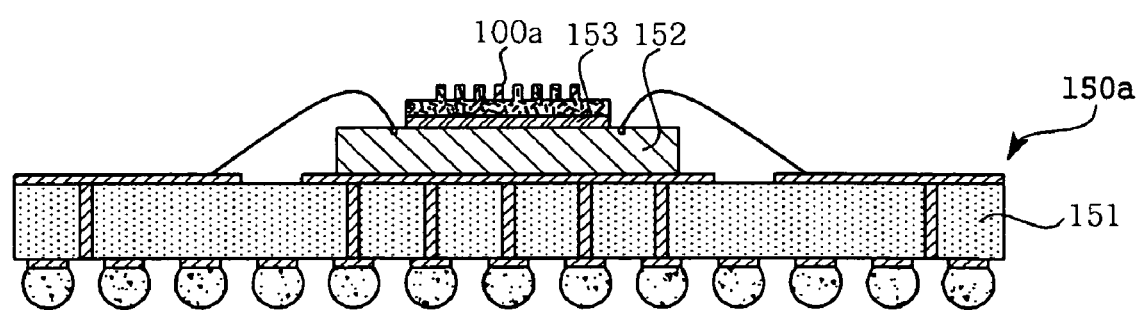
FIG. 3 is a cross-sectional view showing a package substrate including a cooling fin, according to a preferred embodiment of the present invention.
Figure 4:
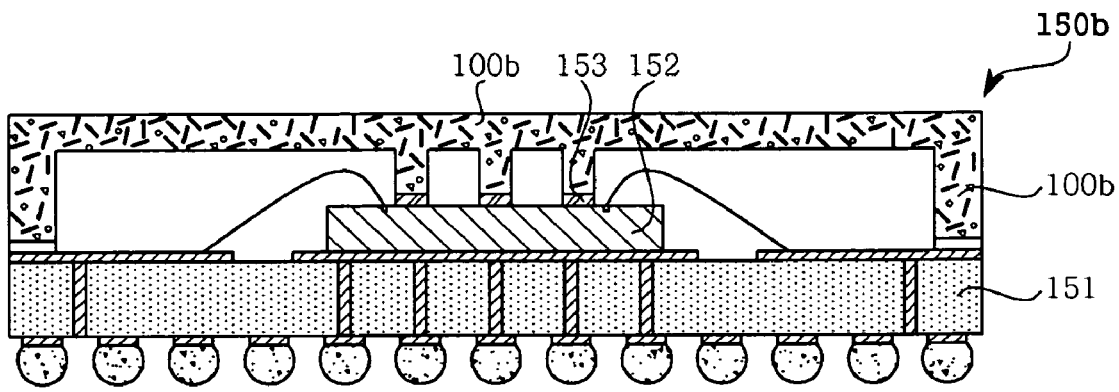
FIG. 4 is a cross-sectional view showing a package substrate including a cooling fin, according to another embodiment of the present invention.
Figure 5:
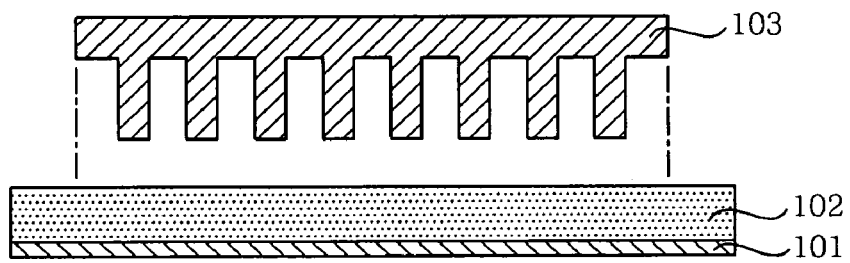
FIGS. 5 to 9 are cross-sectional views showing a method of manufacturing a cooling fin, according to an embodiment of the present invention.
Figure 6:
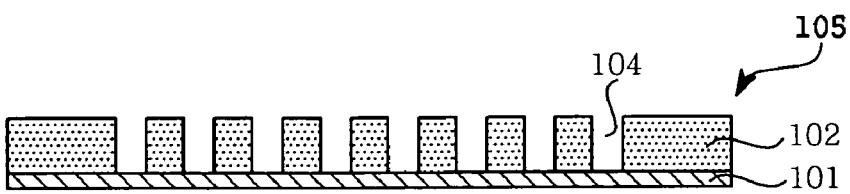
Figure 7:
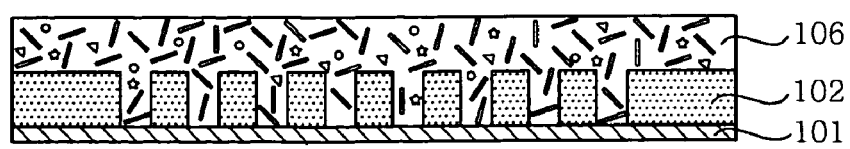

FIG. 2 is a cross-sectional view showing a cooling fin according to a preferred embodiment of the present invention, FIG. 3 is a cross-sectional view showing a package substrate including a cooling fin, according to a preferred embodiment of the present invention, FIG. 4 is a cross-sectional view showing a package substrate including a cooling fin, according to another embodiment of the present invention, and FIGS. 5 to 7 are cross-sectional views showing a method of manufacturing a cooling fin, according to an embodiment of the present invention.

Referring to FIG. 2, a cooling fin $100a$ according to an embodiment of the present invention is now described.

In this embodiment of the present invention, the cooling fin $100a$ is distinctively comprised of a fired object containing a carbon component. In this embodiment, the fired object may include carbon nanotubes, carbon nanofibers, metal microparticles and additives.

Here, the carbon nanotubes or the carbon nanofibers have electrical properties superior to other materials. As an example, Table 1 represents the comparison between the physical properties of a carbon nanotube and those of other materials.

TABLE 1

| Physical properties | carbon nanotube | comparative materials |
| --- | --- | --- |
| density | 1.33~1.40 g/cm$^3$ | 2.7 g/cm$^3$ |
| current density | 1 × 10$^9$ A/cm$^2$ | 1 × 10$^6$ A/cm$^2$ (copper cable) |
| thermal conductivity | 6000 W/mK | 400 W/mk (copper) |
| specific resistance | 1 × 10$^{-10}$ · Ω · cm | 1 × 10$^{-10}$ · Ω · cm (copper) |

As can be appreciated from Table 1, the carbon nanotube has electrical properties better than metal materials such as aluminum and copper, which are relatively excellent in views of electrical conductivity and specific resistance. Consequently, the cooling fin $100a$, which is comprised of a fired object containing a carbon component, has an excellent cooling performance and is thus capable of efficiently radiating heat generated in a printed circuit board.

Although the carbon nanotubes may be comprised of either or both single-walled carbon nanotubes and multi-walled carbon nanotubes, the multi-walled carbon nanotubes, which have electrical conductivity proportional to a diameter thereof, are used in this embodiment.

The metal microparticles, which function to increase adhesiveness and electrical conductivity, may be comprised of high conductive silver (Ag) microparticles, copper (Cu) microparticles or a proper combination thereof.

The additive, which is an element for controlling adhesiveness and printability, may be comprised of one or more selected from among organic/inorganic filler, dye, pigment, thickener, lubricant agent, defoaming agent, dispersing agent, levelling agent, flame retardant, thixotropic agent, brightener, coupling agent which includes a hydrophobic functional group capable of being coupled to resin in molecules as well as a hydrophilic functional group capable of being coupled to inorganic filler. The inorganic filler, which functions to lower a coefficient of thermal expansion, may include spherical/platy/amorphous silica, alumina, diatomous earth and the like. The additive may include an oxide additive, such as pine tar, to eliminate oxides.

Referring to FIG. 2, although the cooling fin $100a$ is shown as being of a specific configuration, for convenience of illustration, it will be apparent that the cooling fin $100a$ according to this embodiment of the present invention is not limited to the configuration and may be of various configurations for improvement of cooling performance. As an example thereof, FIG. 4 illustrates a cooling fin $100b$ having a cover configuration.

Referring to FIGS. 3 and 4, package substrates $150a$ and $150b$, which include cooling fins according to different embodiments of the present invention, are described.

The package substrates $150a$ and $150b$, which include cooling fins according to embodiments of the present invention, are characterized in that the cooling fins $100a$ and $100b$, which are comprised of fired bodies containing a carbon component, are bonded on respective semiconductor chips $152$ which have been mounted on printed circuit boards $152$. In this detailed description, as the cooling fins $100a$ and $100b$ are prepared as described above, the detailed descriptions thereof are omitted for convenience of description.

In this regard, the cooling fins 100a and 100b are bonded on the respective semiconductor chips 152 using adhesives 153 etc.

Referring first to FIG. 3, the package substrate 150a including the cooling fin, according to an embodiment of the present invention is configured such that the cooling fin 100a is directly bonded on a semiconductor chip 152 using an adhesive 153 to radiate heat generated from the semiconductor chip 152.

Referring then to FIG. 4, the package substrate 150b including the cooling fin, according to another embodiment of the present invention, is configured such that the cooling fin 100b is formed into a cover shape for covering an upper surface of a printed circuit board 151 including a semiconductor chip 152 mounted on the printed circuit board 151 in a sealing manner. In practice, the package substrate 150a including the cooling fin, as shown in FIG. 3, is encapsulated in resin sealing material, such as EMC molding material, so as to protect the semiconductor chip 152 and the printed circuit board 151 from the external environment. Meanwhile, the package substrate 150b including the cover-shaped cooling fin, as shown in FIG. 4, is designed such that the cooling fin 100b seals off and shields the semiconductor chip 152 and the printed circuit board 151 from the external environment, thus obviating the necessity of providing an additional resin encapsulation and solving the deterioration of cooling efficiency due to the resin encapsulation. In other words, the adoption of the cover-shaped cooling fin 100b enables realization of the sealing function as well as of the cooling function.

Referring to FIGS. 3 and 4, although the semiconductor chip 152 is shown mounted on the printed circuit board 151 through a wire bonding technology, it is proposed merely for illustration of an example thereof. Alternatively, the semiconductor chip 152 may be mounted on the printed circuit board 151 through a flip-chip bonding technology, and it is applicable to various kinds of package substrates and memory chips.

A process of manufacturing the cooling fin according to an embodiment of the present invention is described with reference to FIGS. 5 to 9.

As shown in FIG. 5, a resin layer is first formed on one side of a support base 101, and then the resin layer 102 is imprinted with a stamp 103.

In this regard, the support base 101, which is adapted to support the resin layer 102, is preferably constructed to have at least the specific strength required to serve as supporting means. Although the support base 101 may be comprised of a variety of metals and polymers, in particular, releasable polymers, it is comprised of a copper foil in one embodiment.

The resin layer 102, which is in a semicured state, may be formed on one side of the support base 101 in an appropriate way, such as spin coating, droplet dispensing and spraying. In addition, any other process of forming the resin layer 102 on the support base 101 through a known way other than the above-mentioned ways should be understood to fall within the scope of the present invention.

The resin layer 102 may be comprised of any thermosetting resin or thermoplastic resin. More specifically, the resin layer 102 may be comprised of any of the thermosetting resins, such as vinyl ester resin, unsaturated polyester resin, maleimide resin, polycyanate resin, epoxy resin, phenol resin and vinyl benzene compound, and thermoplastic resin, such as polyetherimide resin, polyether sulfone resin and dicylcopentadiene resin.

The stamp 103 is intended to imprint the resin layer 102, which is in a semicured state, with a pattern, thereby defining desired patterned grooves 104 on the resin layer 102 which have been adapted to form the cooling fin. The pattern of the stamp 103 corresponds to the grooves 104 used for forming the cooling fin. The pattern of the stamp may have various shapes suitable for increasing the surface area of the cooling fin, or may have a fine structure suitable for forming the grooves 104 adapted to form a cooling fin having a respective fin thickness of several micrometers.

As shown in FIG. 6, after the imprinting of the resin layer 102, the stamp 103 is removed, thus preparing a mold 105. At this point, by the removal of the stamp 103, the resin layer 102 is provided with the cooling fin-defining grooves 104 which correspond to the pattern of the stamp 103.

Additionally, after the removal of the stamp 103, an operation of drying the semicured resin layer 102 thus permitting the curing of the resin layer to be done.

Subsequently, as shown in FIG. 7, fireable paste 106 containing a carbon component is printed on the one surface of the support base 101 in which the cooling fin-defining grooves 104 are formed.

The fireable paste 106 containing a carbon component is normally comprised of a mixture of binder and powdered carbon nanotubes or carbon nanofibers powder, and may further include metal microparticles, additives and the like.

In this embodiment, the fireable paste 106 may comprise about 75-85 wt % of carbon nanotubes or carbon nanofibers, about 5-10 wt % of binder and about 5 wt % of additive. Herein, since the details of the carbon nanotubes or carbon nanofibers, the metal microparticles and the additive has been previously described above, the description is omitted.

The binder, which is intended to control elasticity and adhesivity of the fireable paste 106, may be used in a varying weight composition depending on need. For example, the binder may include one or more types of thermosetting resin, such as epoxy resin, cyanic acid ester resin, bismaleimide (BMI) resin, polyimide resin, benzocyclobutene (BCB) resin and phenol resin, thermoplastic resin, such as polyurethane resin, polyamideimide resin and polyphenylene ether resin, and UV curing resin. Furthermore, binder may be selected from the group consisting of polyethylene oxide, polypropylene carbonate and a combination thereof. This allows firing at a low temperature and easy decomposition of the binder during the firing process, thus preventing deterioration of the carbon nanotubes or carbon nanofibers and improving thermal conductivity.

Figure 8:
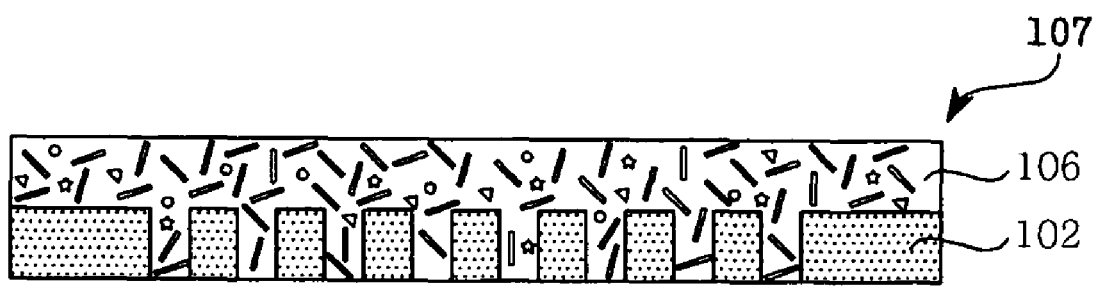

As shown in FIG. 8, the support base 101 is removed to leave a cooling object 107.

In an embodiment, when the support base 101 is embodied as a copper foil, the support base 101 may be removed using etching solution such as iron chloride ($FeCl_5$) etchant, copper chloride ($CuCl_5$), alkali etchant and hydrogen peroxide/sulfuric acid ($H_2O_2/H_2SO_4$). At this time, the fireable paste 106 is not etched even by the etching solution.

Figure 9:
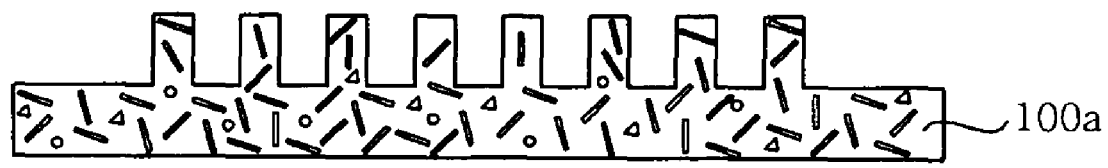

As shown in FIG. 9, the cooling object 107 is subjected to a firing process so as to eliminate the binder and the resin layer 102, thus preparing the cooling fin 100a as illustrated in FIG. 2.

At this point, as the fireable paste 106 is heated to a temperature of 500° C. or higher during the firing process, the binder contained in the paste binds the carbon nanotubes or carbon nanofibers to each other and is then thermally decomposed and thus eliminated. Further, since the resin layer 102 included in the cooling object 107 is also thermally decomposed at a temperature of 300° C. or higher, it is eliminated after the firing process. As a result, the cooling fin 100a is comprised of a fired object containing carbon nanotubes or carbon nanofibers, metal microparticles and an additive.

Meanwhile, since the cover-shaped cooling fin 100b, as shown in FIG. 4, is also manufactured through a process which is substantially identical to the above process used in the manufacture of the cooling fin 100a, the description thereof is omitted.

When the binder and the resin layer still remain even after the firing process, a process may be further conducted such that the binder and the resin layer are eliminated using reactive ion etching (RIE) technology for improvement of the cooling performance. The reactive ion etching technology is conducted in such a manner as to react active species existing in a plasma of reactive gas with atoms on the surface of an etching target material to generate volatile reaction products, and then separate the volatile reaction products from the surface of the etching target material. In this embodiment of the present invention, the reactive ion etching may be conducted through a dielectric barrier discharge (DBD) using inert gases such as argon (Ar) or helium (He).

The package substrates 105a and 150b, each including the cooling fin, according to an embodiment of the present invention, is manufactured by bonding the cooling fins 100a and 100b, which have been prepared in the above-described way, to respective printed circuit boards 151 on which semiconductor chips 152 are mounted. The process of manufacturing the package substrates is now described with reference to FIGS. 3 and 4.

In a process of manufacturing the package substrate 150a according to an embodiment of the present invention, as shown in FIG. 3, an adhesive 153 is applied onto a semiconductor chip 152 mounted on a printed circuit board 151, and the cooling fin 100a, which has been prepared through the process as shown in FIGS. 5 to 9, is bonded to the semiconductor chip 152 via the adhesive 153.

In a process of manufacturing the package substrate 105b according to another embodiment of the present invention, as shown in FIG. 4, an adhesive is applied on the upper surfaces of a semiconductor chip 152 and a printed circuit board 151, and the cooling fin 152 is bonded in a sealing manner to the semiconductor chip 152 and the printed circuit board 151 via the adhesive.

In the processes, the cooling fins 100a and 100b may be bonded to the semiconductor chip 152 and/or the printed circuit board 151 in a manner such that the cooling fins 100a and 100b are machined through a router process depending on the sizes of the semiconductor chip 152 and the printed circuit board 151, and then the cooling fins are bonded to the semiconductor chip 152 and/or the printed circuit board 151. In this process, "routing" refers to a process of mechanically cutting and/or tailoring the cooling fin 100a or 100b using a router bit.

Alternatively, the process of mounting the cooling fins 100a and 100b on the semiconductor chips 152 which are mounted on the printed circuit boards 151 may be conducted using, for example, an existing chip mounter.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Accordingly, the modifications, additions and substitutions should also be understood to fall within the scope of the present invention.

What is claimed is:

1. A method of manufacturing a cooling fin, comprising:
preparing a mold, which comprises a support base and a resin layer formed on the support base and including on a side thereof a groove, which is configured to form a cooling fin;
printing fireable paste containing a carbon component on a side of the mold that has the groove configured to form a cooling fin;
removing the support base to leave a cooling object; and
firing the cooling object.

2. The method according to claim 1, wherein preparing the mold comprises:
forming the resin layer on a side of the support base;
imprinting the resin layer with a stamp having a pattern corresponding to the groove; and
removing the stamp.

3. The method according to claim 1, further comprising, after printing the fireable paste, drying the fireable paste which is printed.

4. The method according to claim 1, wherein the fireable paste includes carbon nanotubes or carbon nanofibers, metal microparticles and a binder.

5. The method according to claim 4, wherein firing the cooling object causes the resin layer and the binder to be eliminated.

6. The method according to claim 5, further comprising, after firing the cooling object,
removing the resin layer and the binder which are not eliminated by the firing, through reactive ion etching (RIE).

7. A method of manufacturing a package substrate, comprising:
preparing a mold, which comprises a support base and a resin layer formed on the support base and including on a side thereof a groove configured to form a cooling fin;
printing fireable paste containing a carbon component on a side of the mold including the groove;
removing the support base to leave a cooling object;
firing the cooling object to prepare a cooling fin; and
bonding the cooling fin on a semiconductor chip mounted on a printed circuit board.

8. The method according to claim 7, wherein the preparing the mold comprises:
placing the resin layer on a side of the support base;
imprinting the resin layer with a stamp having a pattern corresponding to the groove; and
removing the stamp.

9. The method according to claim 7, further comprising, after printing the fireable paste, drying the fireable paste which is printed.

10. The method according to claim 7, wherein the fireable paste includes carbon nanotubes or carbon nanofibers, metal microparticles and a binder.

11. The method according to claim 10, wherein firing the cooling object causes the resin layer and the binder to be eliminated.

12. The method according to claim 11, further comprising, after firing the cooling object,
removing the resin layer and the binder, which are not eliminated by the firing, through reactive ion etching (RIE).

13. The method according to claim 7, wherein the cooling fin is configured to have a cover structure so as to protect a surface of the printed circuit board including the semiconductor chip from an external environment in a sealing manner.

* * * * *